United States Patent
Kinugawa

(10) Patent No.: US 9,508,583 B2
(45) Date of Patent: Nov. 29, 2016

(54) ARTICLE TRANSPORT CARRIAGE

(71) Applicant: Daifuku Co., Ltd., Osaka-shi (JP)

(72) Inventor: Tomotaka Kinugawa, Shiga (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 14/595,719

(22) Filed: Jan. 13, 2015

(65) Prior Publication Data

US 2015/0197400 A1    Jul. 16, 2015

(30) Foreign Application Priority Data

Jan. 16, 2014 (JP) ................. 2014-006065

(51) Int. Cl.
| | | |
|---|---|---|
| *H01L 21/67* | (2006.01) | |
| *H01L 21/677* | (2006.01) | |
| *B65G 37/00* | (2006.01) | |
| *B65G 35/06* | (2006.01) | |
| *H01L 21/673* | (2006.01) | |

(52) U.S. Cl.
CPC ......... *H01L 21/67775* (2013.01); *B65G 35/06* (2013.01); *B65G 37/00* (2013.01); *H01L 21/6773* (2013.01); *H01L 21/67379* (2013.01); *H01L 21/67733* (2013.01); *H01L 21/67769* (2013.01); *B65G 2201/0297* (2013.01)

(58) Field of Classification Search
CPC .............. H01L 21/67769; H01L 21/6773; H01L 21/67733; H01L 21/67379; H01L 21/67775; B65G 35/06; B65G 1/04; B65G 37/00
USPC ................................. 414/626, 940
See application file for complete search history.

(56) References Cited

U.S. PATENT DOCUMENTS

| | | | |
|---|---|---|---|
| 8,942,844 B2 * | 1/2015 | Takahara | B65G 1/06 700/213 |
| 9,064,918 B2 * | 6/2015 | Takahara | H01L 21/67769 |
| 9,064,921 B2 * | 6/2015 | Shin | H01L 21/67772 |
| 9,073,691 B2 * | 7/2015 | Morimoto | H01L 21/67733 |
| 9,199,793 B2 * | 12/2015 | Takahara | B65G 1/16 |
| 9,230,845 B2 * | 1/2016 | Otsuka | A47F 10/00 |
| 9,266,629 B2 * | 2/2016 | Takahara | B65B 5/00 |
| 2007/0092359 A1 * | 4/2007 | Pickreign | H01L 21/67769 414/281 |
| 2007/0224026 A1 * | 9/2007 | Chang | H01L 21/67706 414/626 |
| 2013/0202392 A1 * | 8/2013 | Morimoto | H01L 21/67733 414/267 |
| 2015/0003941 A1 * | 1/2015 | Takahara | B65G 1/16 414/269 |
| 2015/0003942 A1 * | 1/2015 | Takahara | A47B 81/00 414/277 |
| 2015/0197400 A1 * | 7/2015 | Kinugawa | H01L 21/67379 414/458 |

FOREIGN PATENT DOCUMENTS

| | | |
|---|---|---|
| JP | 6321316 A | 11/1994 |
| JP | 2007246272 A | 9/2007 |
| JP | 2008179427 A | 8/2008 |

* cited by examiner

*Primary Examiner* — Andrew J Triggs
(74) *Attorney, Agent, or Firm* — The Webb Law Firm

(57) ABSTRACT

An article transport carriage includes a carriage main body configured to travel along a travel path, a support portion configured to support a bottom surface of an article from below, a projecting and retracting actuator for projecting and retracting the support portion between a projected position and a retracted position, a pressure applying portion located directly above the article supported by the support portion in the retracted position, and a distance changing actuator for changing the distance in the vertical direction between the support portion and the pressure applying portion between a pressure applying distance and a spaced apart distance.

8 Claims, 6 Drawing Sheets

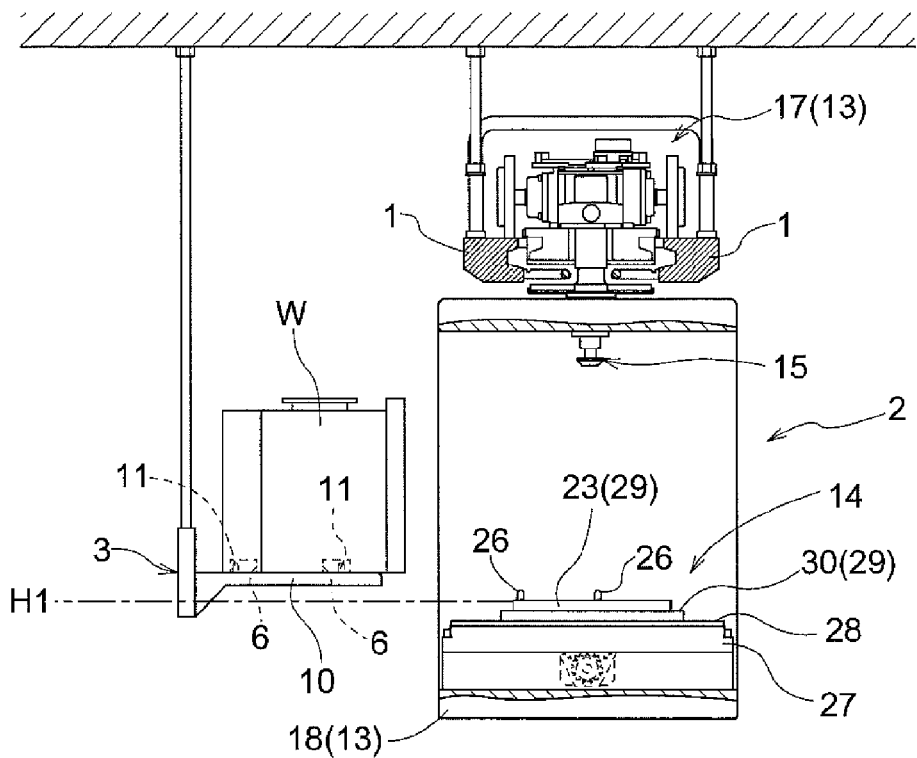
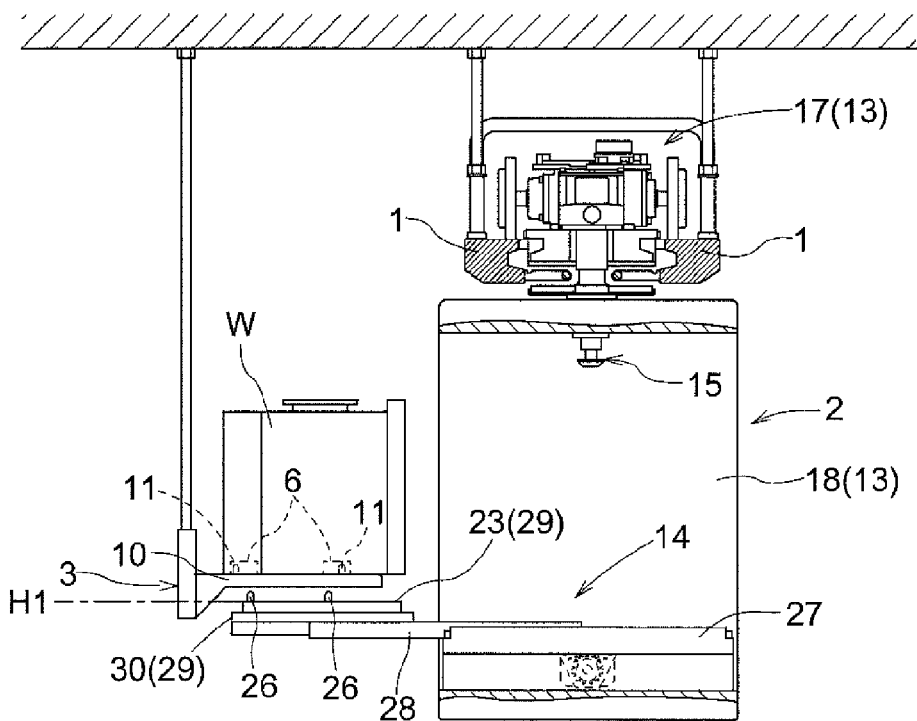

ARTICLE TRANSPORT CARRIAGE

CROSS-REFERENCE TO RELATED APPLICATION

This application claims priority to Japanese Patent Application No. 2014-006065 filed Jan. 16, 2014, the disclosure of which is hereby incorporated in its entirety by reference.

FIELD OF THE INVENTION

The present invention relates to an article transport carriage comprising a carriage main body configured to travel along a travel path, a support portion configured to support a bottom surface of an article from below, and a projecting and retracting actuator for horizontally projecting and retracting the support portion between a projected position in which the support portion is projected toward a transfer target location located to a side with respect to the carriage main body and a retracted position in which the support portion is retracted from the projected position toward the carriage main body.

BACKGROUND

An example of article transport carriages such as one described above is described in JP Publication of Application No. H06-321316 (Patent Document 1). When transporting an article to a transfer target location with the article transport carriage of Patent Document 1, the article is transported to the transfer target location by causing the carriage main body to travel to a stop position that corresponds to the transfer target location with the article supported by the support portion, and thereafter by causing the support portion to be projected and retracted between the projected position and the retracted position by means of the projecting and retracting actuator. And when transporting an article from a transfer target location, the article is received from the transfer target location by causing the carriage main body to travel to a stop position that corresponds to the transfer target location with no article supported by the support portion, and thereafter by causing the support portion to be projected and retracted between the projected position and the retracted position by means of the projecting and retracting actuator. Subsequently, the carriage main body is caused to travel from the stop position with the article supported by the support portion.

SUMMARY OF THE INVENTION

With the article transport carriage of Patent Document 1, the article supported by the support portion is supported by the bottom surface of the article only from below by the support portion; thus, there is a possibility that the article may lift off from, or tilt on, the support portion, for example, when the carriage main body travels over a sudden raise or drop in the travel rails, or goes through acceleration or deceleration etc. And even when the article is fit into the support portion in the vertical direction to prevent the article from falling, the fitting engagement may be released due to the lifting or tilting of the article, allowing the article to fall from the support portion. And when the article consists of a plurality of loads, the loads may collapse due to the lifting or tilting of the article.

To this end, it is desirable to provide an article transport carriage which can support an article such that the article is stably supported by the support portion when causing the carriage main body to travel while the support portion, which is projected and retracted between the retracted position and the projected position, is supporting an article.

An article transport carriage in accordance with the present invention comprises: a carriage main body configured to travel along a travel path; a support portion configured to support a bottom surface of an article from below; a projecting and retracting actuator for horizontally projecting and retracting the support portion between a projected position in which the support portion is projected toward a transfer target location located to a side with respect to the carriage main body and a retracted position in which the support portion is retracted from the projected position toward the carriage main body; a pressure applying portion located directly above the article supported by the support portion in the retracted position; a distance changing actuator for changing a subject distance which is a distance along the vertical direction between the support portion and the pressure applying portion; wherein the distance changing actuator is configured to change the subject distance to a pressure applying distance at which the pressure applying portion applies pressure from above on the article supported by the support portion, by moving the support portion in the retracted position and the pressure applying portion closer toward each other along the vertical direction, and is configured to change the subject distance to a spaced apart distance at which the support portion is allowed to be projected and retracted, by moving the support portion in the retracted position and the pressure applying portion away from each other along the vertical direction.

With the arrangement above, by changing the distance between the support portion and the pressure applying portion to the spaced apart distance by means of the distance changing actuator, the article can be transferred to or from the transfer target locations by projecting and retracting the support portion between the projected position and the retracted position without the article supported by the support portion interfering with the pressure applying portion.

In addition, since the pressure applying portion is located directly above the article when the support portion supporting the article is located in the retracted position, the pressure applying portion can be caused to apply pressure from above on the article supported by the support portion by changing the distance between the support portion and the pressure applying portion to the pressure applying distance by means of the distance changing actuator.

Thus, by causing the carriage main body to travel along the travel path with the support portion supporting the article located in the retracted position, and with the distance between the support portion and the pressure applying portion set to the pressure applying distance, lifting and tilting of the article can be prevented by the virtue of the fact that pressure is applied by the pressure applying portion on the article supported by the support portion. Thus, the article can be stably supported by the support portion when causing the carriage main body to travel with the support portion supporting the article.

Examples of preferred embodiments of the present invention are described next.

In an embodiment of the article transport carriage in accordance with the present invention, the article transport carriage preferably further comprises a transfer vertical movement actuator for vertically moving the support portion in the projected position between a loading height and a unloading height which is lower than the loading height, when transferring an article to or from the transfer target location.

With the arrangement above, an article at the transfer target location can be loaded, or picked up, by the support portion as follows. With the article located at a transfer target location and with the support portion supporting no article, the support portion at the unloading height is projected from the retracted position to the projected position. Subsequently, the support portion is raised from the unloading height to the loading height; thereafter, the support portion is retracted from the projected position to the retracted position.

In addition, an article supported by the support portion can be unloaded to the transfer target location as follows. With no article located at the transfer target location and with the support portion supporting the article, the support portion at the loading height is projected from the retracted position to the projected position. Subsequently, the support portion is lowered from the loading height to the unloading height; thereafter, the support portion is retracted from the projected position to the retracted position.

As such, since an article can be transferred to or from a transfer target location by the projecting and retracting movement and vertical movement of the support portion, there is no need to provide a device for loading and unloading an article to or from the support portion in the transfer target location; thus, structures at and around the transfer target location can be simplified.

In an embodiment of the article transport carriage in accordance with the present invention, preferably defined as a height of the support portion is a pressure applying height which is higher than the loading height, and at which the subject distance becomes the pressure applying distance, wherein the loading height is preferably defined to be a height at which the subject distance becomes the spaced apart distance, and wherein the transfer vertical movement actuator is preferably configured to be able to change the height of the support portion to any of the loading height, the unloading height, and the pressure applying height, and is configured to function also as the distance changing actuator.

With the arrangement above, the distance between the support portion and the pressure applying portion becomes the spaced apart distance when the support portion is vertically moved to the loading height. And the distance between the support portion and the pressure applying portion becomes the pressure applying distance when the support portion is raised to the pressure applying height. Thus, the transfer vertical movement actuator can function as a distance changing actuator that can change the distance between the support portion and the pressure applying portion between the spaced apart distance and the pressure applying distance, by vertically moving the support portion between the loading height and the pressure applying height.

Therefore, there is no need to provide an actuator, in addition to and separate from, the transfer vertical movement actuator, solely for changing the distance between the support portion and the pressure applying portion between the spaced apart distance and the pressure applying distance. Thus, the structure for projecting/retracting and vertically moving the support portion can be simplified.

In an embodiment of the article transport carriage in accordance with the present invention, the pressure applying portion preferably includes an elastic member which deforms elastically as the pressure applying portion comes into contact with the article supported by the support portion as the subject distance is changed from the spaced apart distance to the pressure applying distance.

With the arrangement above, the pressure applying portion comes into contact, from above, with the article supported by the support portion by changing the distance between the support portion and the pressure applying portion from the spaced apart distance to the pressure applying distance. And this contact causes the elastic member of the pressure applying portion to deform elastically.

In other words, as a result of the elastic member deforming elastically as the distance between the support portion and the pressure applying portion is changed to the pressure applying distance, the pressure applying portion can retract upwardly relative to the article when contacting the article; thus, damage to the pressure applying portion or to the article, caused by the article being pushed against the pressure applying portion, can be prevented before it happens.

In addition, the urging force of the elastic member causes the pressure applying portion to apply pressure on the article when the distance between the support portion and the pressure applying portion is changed to the pressure applying distance. Thus, the article can be supported more stably by the support portion.

In an embodiment of the article transport carriage in accordance with the present invention, the carriage main body is preferably configured to be able to travel along the travel path while being guided and supported by travel rails provided on a ceiling side.

With the arrangement above, since the carriage main body is guided and supported by the travel rails provided on the ceiling side, the carriage main body travels at a greater height compared with the case where the carriage main body is guided and supported by travel rails provided on the floor. Thus, by preventing the article from falling from the support portion by applying pressure on the article supported by the support portion by means of the pressure applying portion when the carriage main body travels at a greater height, the article can be prevented from falling on a worker working on the floor or apparatus installed on the floor.

BRIEF DESCRIPTION OF THE DRAWINGS

FIG. 3 shows a transport support in a retracted position and at an unloading height,
FIG. 4 shows the transport support in a projected position and at the unloading height.

DETAILED DESCRIPTION

Embodiments of the transport facility equipped with the article transport carriage in accordance with the present invention are described with reference to the drawings.

Figure 1:
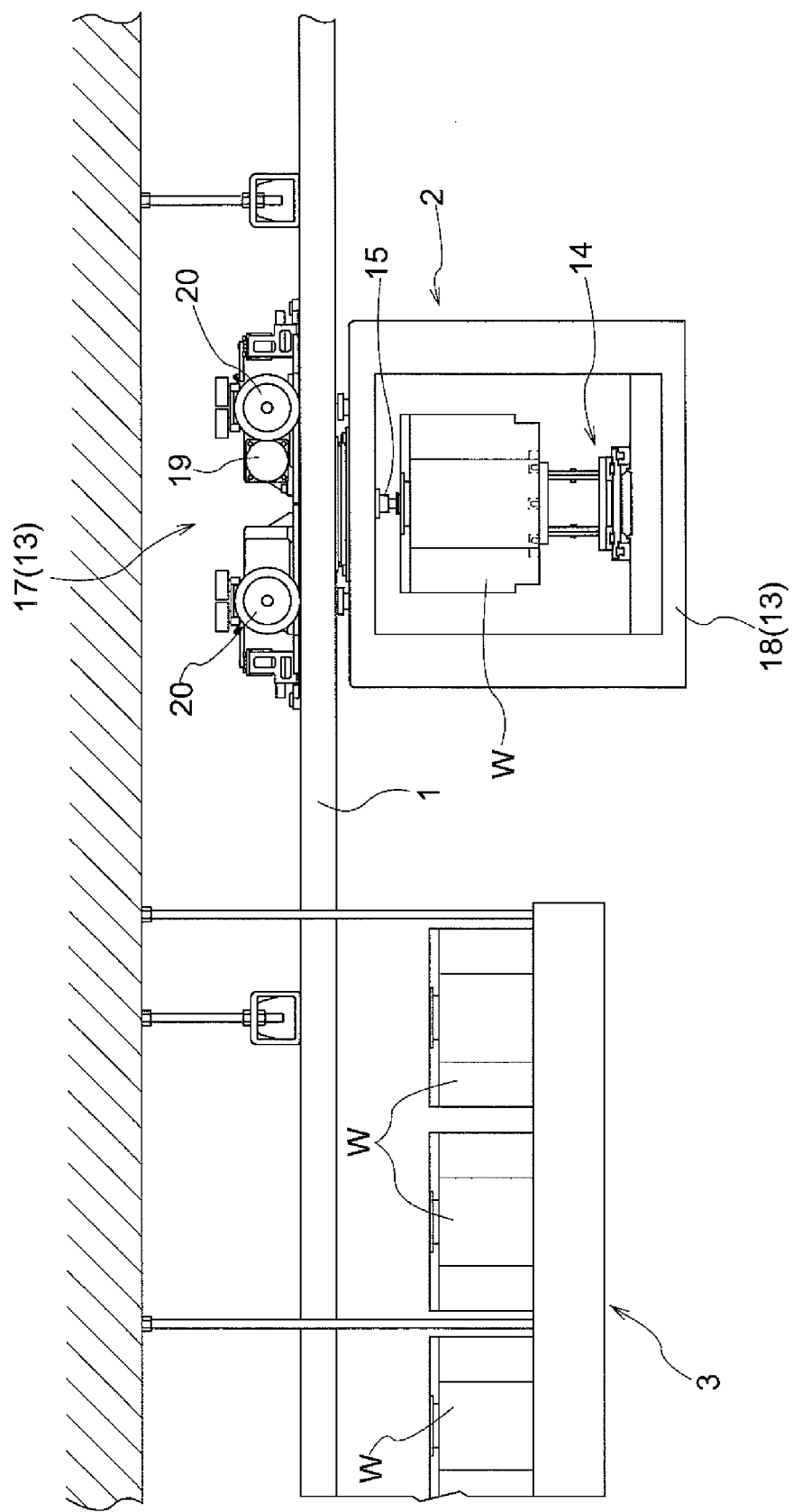
FIG. 1 is a side view of a transport facility.
Figure 2:
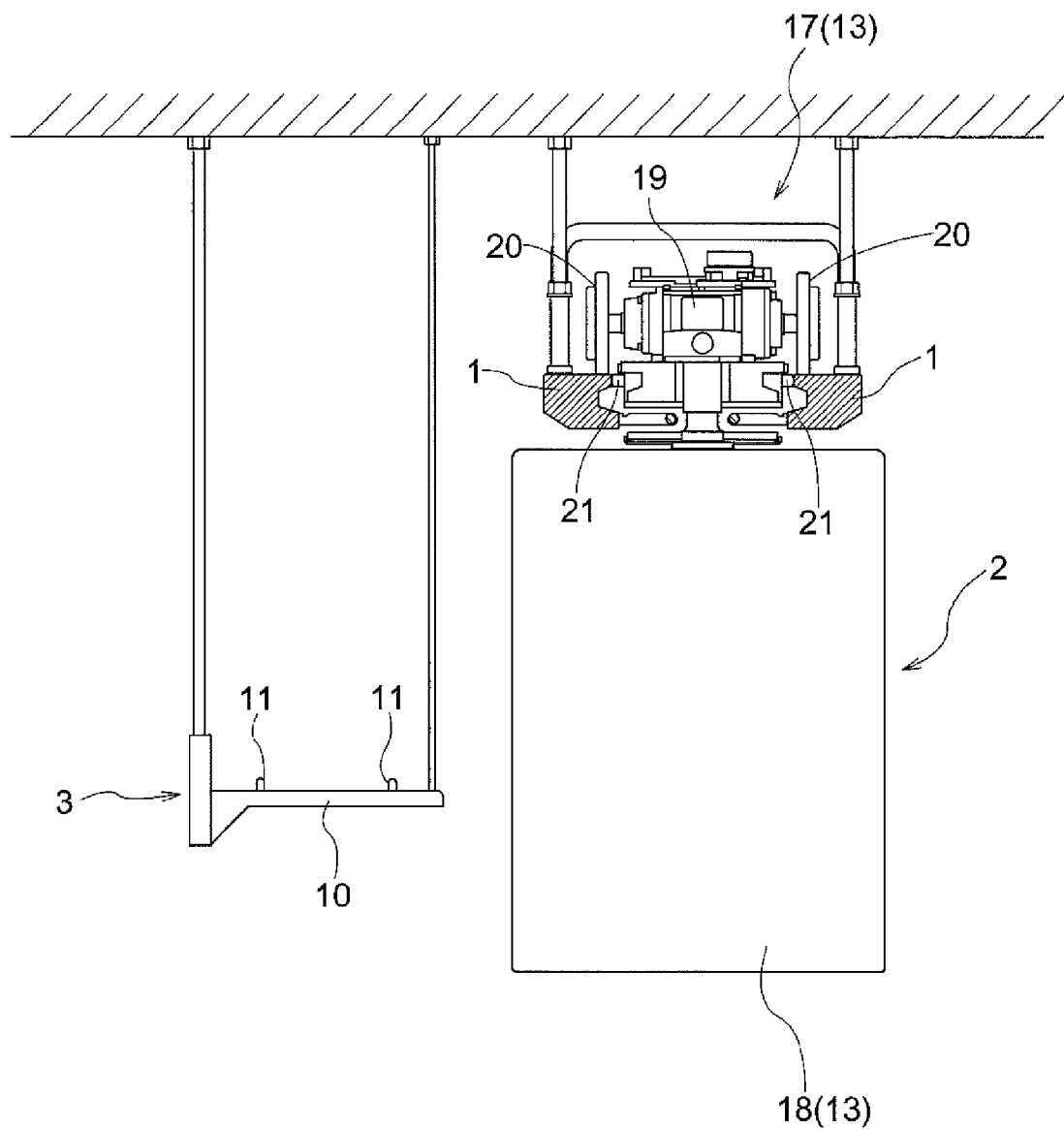
FIG. 2 is a front view of the transport facility.

As shown in FIGS. 1 and 2, the transport facility includes travel rails 1 provided on the ceiling side and along a travel path, a ceiling, or overhead, transport vehicle 2 which functions as an article transport carriage which can travel along the travel path while guided and supported by the travel rails 1, and storage racks 3, installed to a side of, or to a side with respect to, the travel path, for storing articles W. The ceiling transport vehicle 2 is configured to transport articles W transported from other locations to a storage rack 3 one article at a time, and to transport the articles W stored by a storage rack 3 to other locations, one article at a time.

The direction along the travel direction of the ceiling transport vehicle 2 will be referred to as the fore and aft direction whereas the direction (direction along the horizontal plane in the present example) which is perpendicular to the fore and aft direction in plan view will be referred to as the lateral direction. In addition, either one of the directions along the lateral direction may be sometimes characterized by the use of the expression "to a side" in the description.

[Article]

Figure 8:
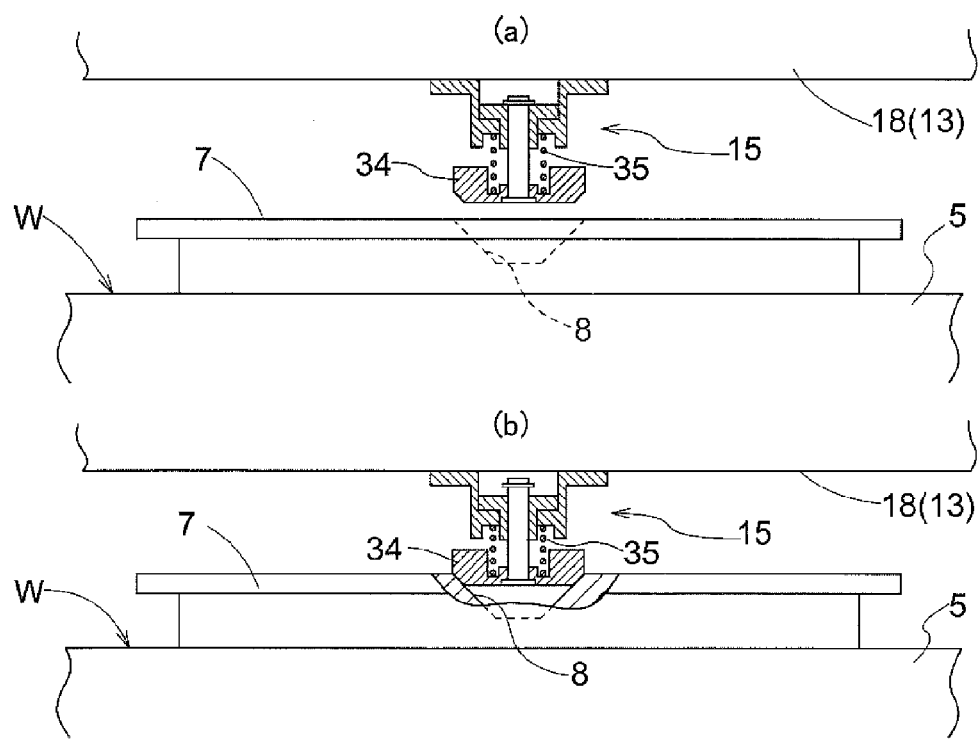
FIG. 8 is a Fig. showing the upper portion of the article and pressure applying portion.

FIG. 8 shows an upper portion of the article W, and a pressure applying portion 15 described below. As shown in FIG. 8, the article W includes a holding portion 5 for holding, storing, or carrying, a plurality of substrates, and a flange portion 7 which is connected to the top surface of this holding portion 5 and thus is located in an upper end portion of the article W. Incidentally, the ceiling transport vehicle 2 of the present embodiment is a transport vehicle of a receiving support type which transports an article W while supporting the bottom surface of the holding portion 5 (article W). While not shown, there is also a transport vehicle of a suspending type which transports an article W while supporting the undersurface of the flange portion 7 from below so that the article W can be transported while being suspended and supported by the transport vehicle of the suspending type. The transport vehicle of a suspending type may sometimes have fall prevention members which can be moved horizontally at locations below the article W being suspended and supported, to receive from below the article W which is about to fall to the floor in the event that the supporting of the flange portion 7 is disengaged. In contrast, the transport vehicle of the receiving support type supports the article W with the article received and supported from below by receiving and supporting the bottom surface of the article W; thus, it is configured not to require any fall prevention members.

Figure 9:
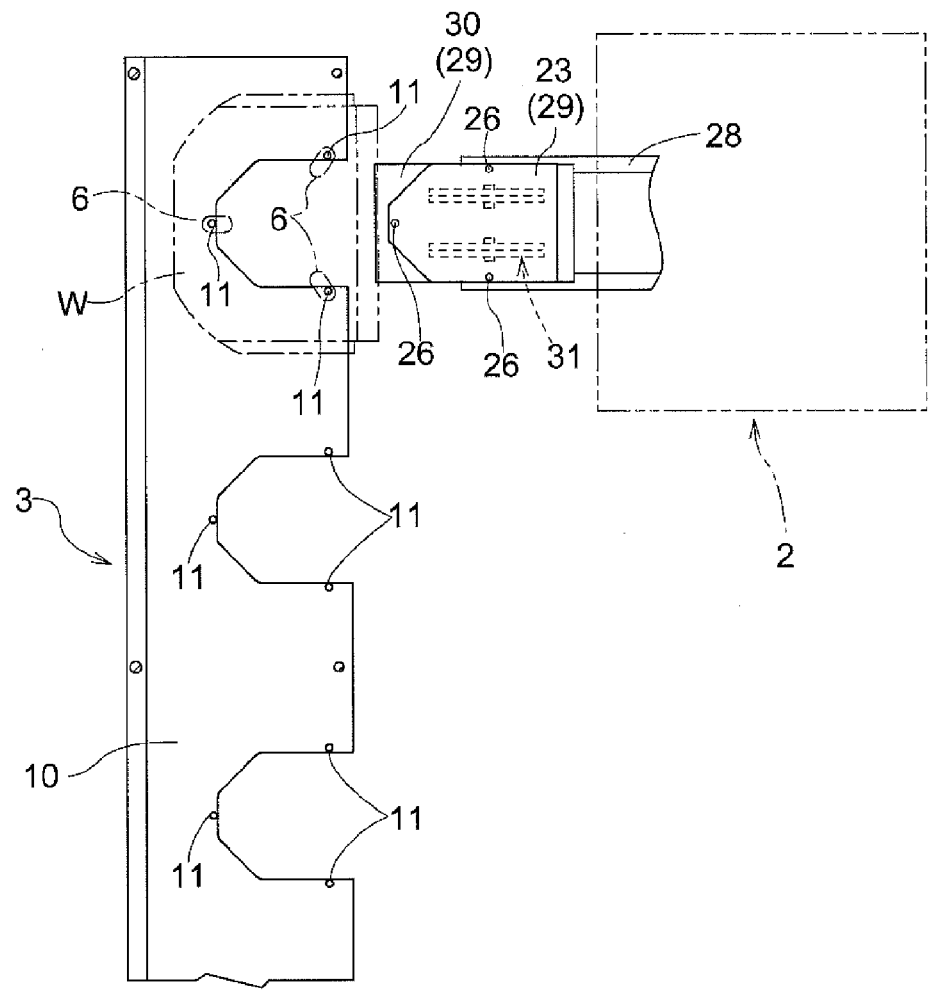
FIG. 9 is a plan view of the transport facility.

As shown in FIGS. 3-7, bottom surface recessed portions 6 are formed in the bottom surface of the holding portion 5 (bottom surface of the article W) such that each recessed portion is recessed upwardly. As shown in FIG. 9, these bottom surface recessed portions 6 are formed at three locations that correspond to the locations of the storage projections provided in the storage rack 3 and the transport projections provided to the ceiling transport vehicle 2 so that storage projections 11 and the transport projections 26 can engage respective bottom surface recessed portions 6.

As shown in FIG. 8, a top surface recessed portion 8 is formed in the top surface of the flange portion 7 (top surface of the article W) such that the top surface recessed portion 8 is recessed downwardly. This surface recessed portion 8 is formed at the center of the flange portion 7 both in the fore and aft direction and in the lateral direction so that pressure applying portion 15 of the ceiling transport vehicle 2 can fit into it.

In the present embodiment, the article W is a FOUP (Front Opening Unified Pod) which stores, carries, or holds semiconductor wafers as substrates.

[Storage Rack]

As shown in FIGS. 2 and 9, a plurality of storage racks 3 are provided to a side of, and along, the travel path along which the ceiling transport vehicle 2 travels. The storage racks 3 are provided at the same height as the ceiling transport vehicle 2 traveling along the travel path.

Each of the plurality of storage racks 3 is, or corresponds to, an article transfer location located to a side of, or with respect to, the carriage main body 13 of the ceiling transport vehicle 2.

Each storage rack 3 includes a storage support 10 which supports the bottom surface of the article W from below. Each storage support 10 is formed such that it has a general shape of a letter "C", or is C-shaped, with a portion cut out from a rectangular plate member, in plan view, and is configured to support the peripheral portion of the bottom surface of the article W.

In addition, each storage support 10 has storage projections 11 at three locations for engaging respective bottom surface recessed portions 6 of the article W. The storage support 10 is configured to be able to support the article W such that the article W is positioned at a predetermined storage position on the storage support 10, by supporting the article W with the three storage projections 11 engaged with the bottom surface recessed portions 6 of the article W.

[Ceiling Transport Vehicle]

As shown in FIGS. 1 and 2, the ceiling, or overhead, transport vehicle 2 includes a carriage main body 13 which is configured to travel along a travel path while guided and supported by the travel rails 1 provided on the ceiling side, a transfer device 14 for transferring an article W from itself to the storage rack 3, or from the storage rack 3 to itself, and a pressure applying portion 15 for applying pressure from above on, or force from above against, the article W supported by the transfer device 14.

The carriage main body 13 includes a travel portion 17 configured to travel on the travel rails 1 along the travel path, and a main body portion 18 which is suspended from, and supported by, the travel portion 17 such that it is located under the travel rails 1 and which supports the transfer device 14 and the pressure applying portion 15.

The travel portion 17 includes drive wheels 20 which are driven and rotated by a travel motor 19 to roll on the top surfaces of the travel rails 1, and rotatable guide wheels 21 which are in contact with the side faces of the travel rails 1. And the travel portion 17 is configured to travel along the travel path while guided by the travel rails 1 by virtue of the fact that the drive wheels 20 are driven and rotated by the travel motor 19, and that the guide wheels 21 are in contact with, and thus are guided by, the travel rails 1.

As shown in FIG. 1, the main body portion 18 is formed in a shape of a tube with its hollow inner space extending in the lateral direction and with two lateral openings, and supports the transfer device 14 such that it is located in the lower portion of the interior space of the main body portion 18, and supports, or suspends, the pressure applying portion 15 such that it is located in the upper portion of the interior space of the main body portion 18. In other words, the main body portion 18 supports the transfer device 14 and the pressure applying portion 15 such that the pressure applying portion 15 is located above the transfer device 14.

Figure 10:
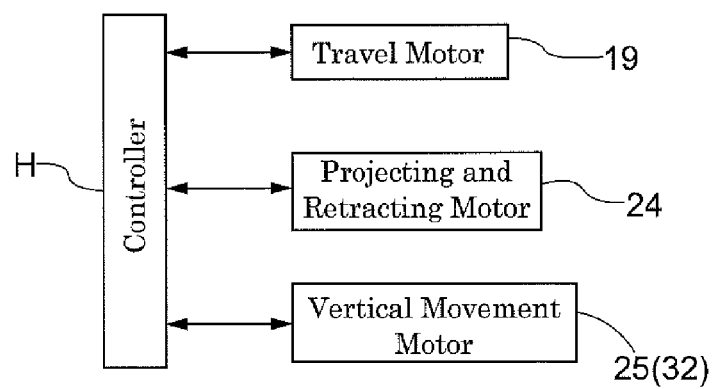
FIG. 10 is a control block diagram.

As shown in FIGS. 4-8, the transfer device 14 includes a transport support 23 which functions as a support portion for supporting the bottom surface of the article W from below, a projecting and retracting motor 24 (see FIG. 10) which functions as a projecting and retracting actuator for projecting and retracting the transport support 23 along the lateral direction between a projected position (see FIGS. 4 and 5) and a retracted position (see FIGS. 3, 6, and 7), and a vertical movement motor 25 (see FIG. 10) which functions as a transfer vertical movement actuator for vertically moving, or raising and lowering, the transport support 23. The vertical movement motor 25 is configured to be able to change the height, or vertical position, of the transport support 23 to any height among an unloading height H1 (see FIGS. 3 and 4), a loading height H2 (see FIGS. 5 and 6), and a pressure applying height H3 (see FIG. 7). When transferring an article between the ceiling transport vehicle 2 and a storage rack 3, the vertical movement motor 25 vertically moves the transport support 23 between the loading height H2 and the unloading height H1, in the projected position.

As shown in FIG. 9, the transport support 23 is formed to have a shape that allows it to move vertically through the cut out portion of the storage support 10, and is configured to support the center portion of the bottom surface of the article W (i.e., the portion not supported by the storage support 10).

In addition, the transport support 23 has transport projections 26 at three locations for engaging the bottom surface recessed portions 6 of the article W. The transport support 23 is configured to be able to support the article W such that the article W is positioned at a predetermined storage position on the transport support 23, by supporting the article W with the three transport projections 26 engaged with the bottom surface recessed portions 6 of the article W.

As shown in FIGS. 3-7, the transfer device 14 includes a base portion 27 connected to the carriage main body 13, a relay portion 28 which can slide and move along the lateral direction with respect to this base portion 27, and a distal end portion 29 which can slide and move along the lateral direction with respect to this relay portion 28. In addition, the distal end portion 29 includes a slide body 30 connected to the relay portion 28, and the above-described transport support 23 which can be vertically moved with respect to the slide body 30.

The base portion 27, the relay portion 28, and the distal end portion 29 are operatively connected to each other by an operatively connecting mechanism (not shown). And the transfer device 14 is so configured that, because of the operative connection by the operatively connecting mechanism, the distal end portion 29 is caused to slide to the projecting side with respect to the relay portion 28 when the relay portion 28 is caused to slide to the projecting side (to a lateral side) with respect to the base portion 27, and the distal end portion 29 is caused to slide to the retracting side with respect to the relay portion 28 when the relay portion 28 is caused to slide to the retracting side with respect to the base portion 27.

And the transfer device 14 is configured to project and retract the transport support 23 between the projected position and the retracted position by projecting and retracting the distal end portion 29 along the lateral direction by causing the relay portion 28 to slide with respect to the base portion 27 by the driving power from the projecting and retracting motor 24.

The projected position is a position projected or located toward the storage support 10 located to a side in the lateral direction with respect to the main body portion 18. And the transport support 23 (the whole of the transport support 23, in the present example) in the projected position is located to a side in the lateral direction of, and outside of, the main body portion 18. And the retracted position is a position retracted, or located away, from the projected position toward the carriage main body 13. And the transport support 23 (the whole of the transport support 23 in the present example) in the retracted position is located within the interior space of the main body portion 18.

A linkage mechanism 31 consisting of scissor linkage having a crisscross 'X' pattern is provided between the slide body 30 and the transport support 23. And the transfer device 14 is configured to vertically move the transport support 23 by changing the posture of the linkage mechanism 31 using the drive power from the vertical movement motor 25.

Figure 5:
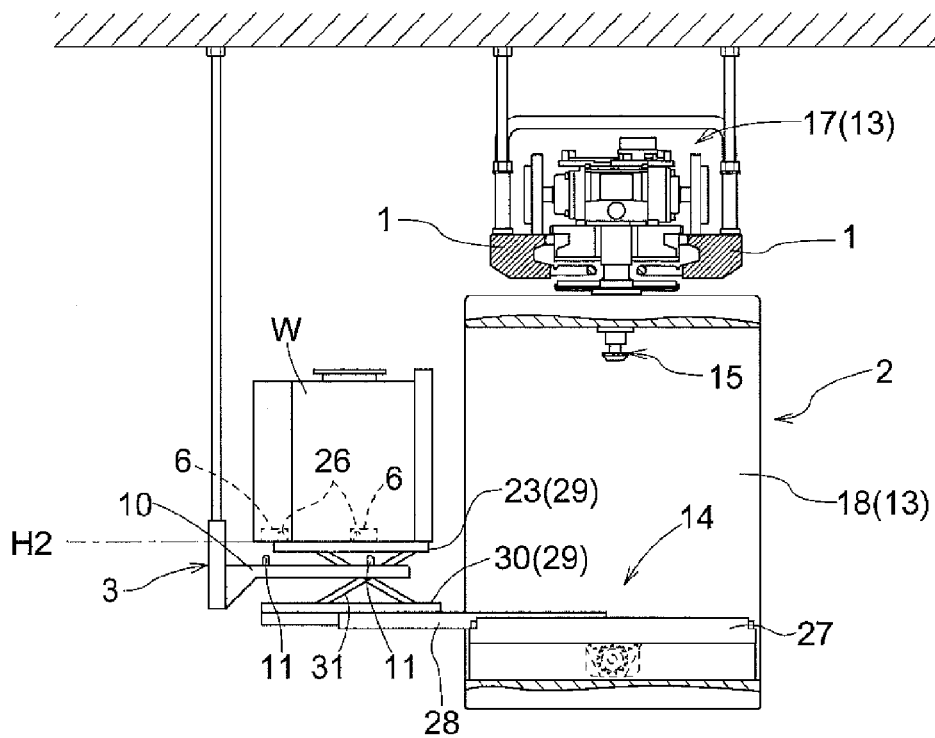
FIG. 5 shows the transport support in a projected position and at a loading height.
Figure 6:
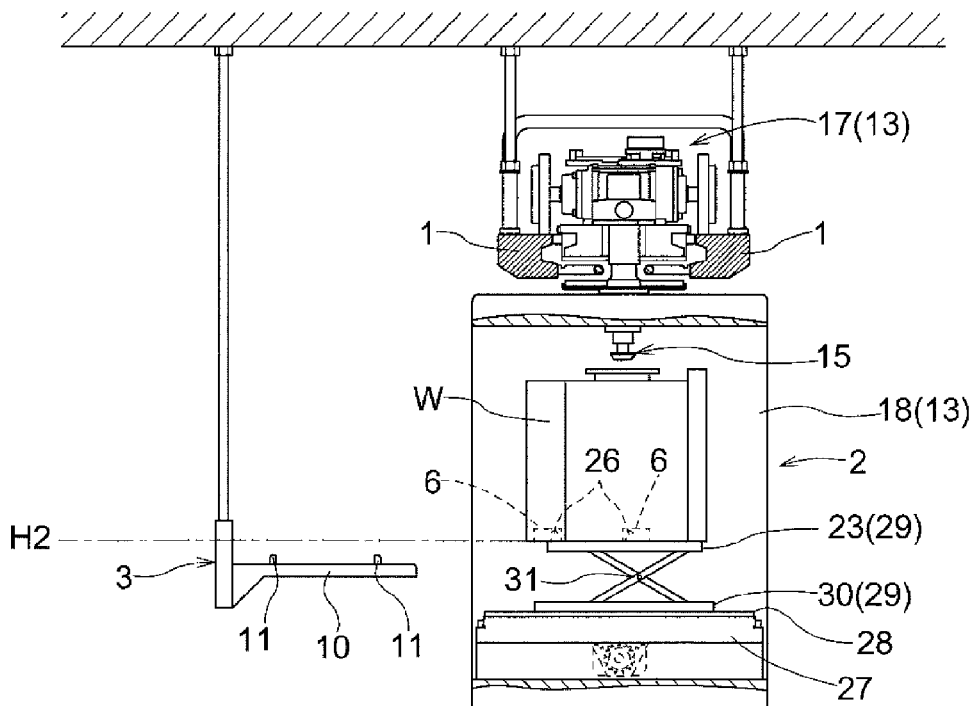
FIG. 6 shows a transport support in a retracted position and at the loading height.
Figure 7:
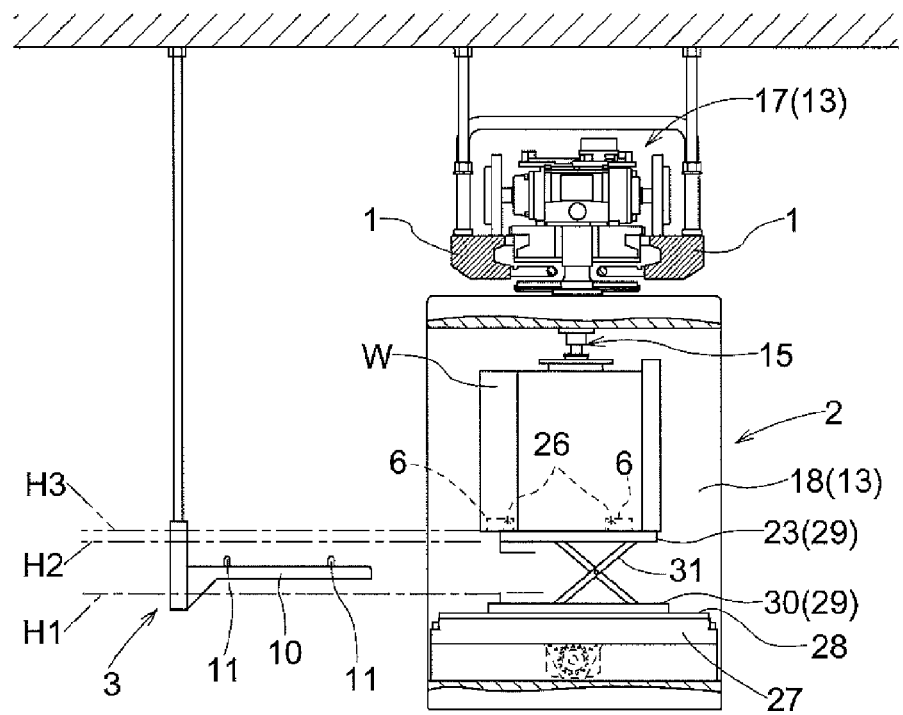
FIG. 7 shows a transport support in a retracted position and at a pressure applying height

Unloading height H1, loading height H2 which is higher than the unloading height H1, and pressure applying height H3 which is higher than the loading height H2 are defined as the height for the transport support 23 (target height for the change). The transport support 23 is vertically moved to a height selected from the unloading height H1, the loading height H2, and the pressure applying height H3, by the drive power from the vertical movement motor 25. When transferring an article W to or from a storage rack 3, the transport support 23 is vertically moved within a transfer vertical movement range from the unloading height H1 to the loading height H2. And when causing the travel portion 17 to travel, the transport support 23 is raised to the pressure applying height H3 which is out of and above the transfer vertical movement range. FIGS. 3 and 4 show the transport support 23 located at the unloading height H1. FIGS. 5 and 6 show the transport support 23 located at the loading height H2. In addition, FIG. 7 shows the transport support 23 located at the pressure applying height H3 with solid lines whereas the transport support 23 located at the unloading height H1 and the loading height H2 is shown with phantom lines.

The top surface of the transport support 23 at the unloading height H1 is located below the top surface of the storage support 10 whereas the top surface of the transport support 23 at the loading height H2 is located above the top surface of the storage support 10. In addition, with the transport support 23 located in the retracted position, when the transport support 23 is located at the loading height H2, the upper end of the article W supported by the transport support 23 is located below the lower end of the pressure applying portion 15; and, when the transport support 23 is located at the pressure applying height H3, the contact portion 34 of the pressure applying portion 15 fits into to the top surface recessed portion 8, so that the upper end of the article W supported by the transport support 23 is located above the lower end of the pressure applying portion 15.

Thus, when the transport support 23 is located at the loading height H2, the article W supported by the transport support 23 does not contact the pressure applying portion 15; thus, the transport support 23 can be projected and retracted between the retracted position and the projected position. In addition, by raising the transport support 23 from the loading height H2 to the pressure applying height H3 with the transport support 23 located in the retracted position, the pressure applying portion 15 comes into contact with the article W supported by the transport support 23; thus, the article W is pressed down from above by the pressure applying portion 15.

And when the transport support 23 raised to the pressure applying height H3 by the drive power from the vertical movement motor 25, the transport support 23 in the retracted position and the pressure applying portion 15 come closer to each other along the vertical direction; thus, the subject distance, which is the distance between the transport support 23 and the pressure applying portion 15 along the vertical direction, is a pressure applying distance at which the pressure applying portion 15 presses down, or applies pressure from above, on the article W supported by the transport support 23. In addition, when the transport support 23 is lowered to the loading height H2 by the drive power from the vertical movement motor 25, the transport support 23 in the retracted position and the pressure applying portion 15 are spaced farther apart from each other along the vertical direction; thus, the subject distance is a spaced apart distance that allows the transport support 23 to be projected and retracted.

In other words, the vertical movement motor 25 also functions as a distance changing actuator 32 which switches, or changes, the distance (subject distance) along the vertical direction between the transport support 23 in the retracted position and the pressure applying portion 15, between the pressure applying distance and the spaced apart distance.

The pressure applying portion 15 includes the contact portion 34 for contacting the article W, and a spring 35 for urging the contact portion 34 downwardly.

As shown in FIG. 8, downward movement of the contact portion 34 from a base position shown in FIG. 8 (*a*) is restricted by a restricting member (not shown). And as shown in FIG. 8 (*b*), upward movement from this restricting position (base position) is possible but is done against the urging force of the spring 35.

The pressure applying portion 15 is provided at the location directly above the article W supported by the transport support 23 in the retracted position. And the contact portion 34 is located directly above the top surface recessed portion 8 of the article W supported by the transport support 23 in the retracted position. That is, the pressure applying portion 15 is provided at such position that it overlaps, from above, with the article W supported by the transport support 23 in the retracted position as seen along the vertical direction. And the contact portion 34 is provided at such position that it overlaps, from above, with the top surface recessed portion 8 of the article W supported by the transport support 23 in the retracted position as seen along the vertical direction.

The contact portion 34 is formed to have a shape of a circular cone that tapers downwardly with its lower portion cut off, or removed. Similarly, the top surface recessed portion 8 is also formed as a recess having a shape of a circular cone that tapers downwardly with its lower portion cut off, or removed. And the contact portion 34 is formed to fit into the top surface recessed portion 8.

And as the transport support 23 is raised from the loading height H2 to the pressure applying height H3, the contact portion 34 fits into the top surface recessed portion 8 before the transport support 23 reaches the pressure applying height H3. And as the transport support 23 is raised further, and as the article is raised further, the contact portion 34 is moved upwardly against the urging force of the spring 35. With the transport support 23 raised to, and at, the pressure applying height H3, the distance (subject distance) along the vertical direction between the transport support 23 and the pressure applying portion 15 is the pressure applying distance; thus, pressure is applied from above on the article W by the urging force of the spring 35, thus by the pressure applying portion 15.

Incidentally, the spring 35 functions as an elastic member which deforms elastically when the pressure applying portion 15 comes into contact with the article W supported by the transport support 23 as the subject distance is switched or changed from the spaced apart distance to the pressure applying distance.

The ceiling transport vehicle 2 has a controller H for controlling the operation of the ceiling transport vehicle 2. The controller H is configured to control the operation of the carriage main body 13 (travel motor 19) to cause the ceiling transport vehicle 2 to travel to a predetermined travel stop position defined with respect to a storage rack 3 that is the transport target. In addition, the controller H is configured to control the operation of the transfer device 14 (the projecting and retracting motor 24 and the vertical movement motor 25) to transfer an article W between the ceiling transport vehicle 2 and the storage racks 3.

The controller H is configured to control operation of the ceiling transport vehicle 2, based on the transport information from a superordinate controller (not shown), to perform a delivering operation in which an article W is delivered to a storage rack 3, and a receiving operation in which an article W is received from a storage rack 3.

In the receiving operation, firstly, receiving travel control for controlling the operation of the travel portion 12 is performed, based on transport information, to cause the ceiling transport vehicle 2 to stop at the travel stop position defined with respect to the storage rack 3 in which the article W to be picked up is stored. When performing the receiving travel control, the transport support 23 is not supporting any article W, and is retracted to the retracted position, and is lowered to the unloading height H1.

And in the receiving operation, after performing the receiving travel control as described above, receiving transfer control for controlling the operation of the transfer device 14 is performed to transfer the article W on the storage support 10 onto the transport support 23. In this receiving transfer control, with the ceiling transport vehicle 2 stopped at the travel stop position, the transport support 23 is raised to the loading height H2 after the transport support 23 is projected to the projected position to receive and place the article W on the transport support 23, after which the transport support 23 is retracted to the retracted position. Subsequently, the transport support 23 is raised to the pressure applying height H3 to cause the pressure applying portion 15 to apply pressure on the article W.

Thus, pressure is applied from above by the pressure applying portion 15 on the article W supported by the transport support 23. And thus when the ceiling transport vehicle 2 is subsequently caused to travel, the ceiling transport vehicle 2 can travel with the pressure applying portion 15 applying pressure from above on the article W so that the article W can be prevented from being lifted off the transport support 23.

In the delivering operation, delivery travel control for controlling the operation of the travel portion 12 is performed first, based on transport information, to cause the ceiling transport vehicle 2 to stop at a travel stop position defined with respect to the storage rack 3 that is to store the article W to be stored. When performing the delivery travel control, the transport support 23 is supporting an article W, and is retracted to the retracted position, and is raised to the pressure applying height H3. Thus, pressure is applied from above by the pressure applying portion 15 on the article W supported by the transport support 23.

And in the delivering operation, after performing the delivery travel control as described above, a delivery transfer control for controlling the operation of the transfer device 14 is performed to transfer the article W on the transport support 23 onto the storage support 10. In this delivery transfer control, with the ceiling transport vehicle 2 stopped at the travel stop position, the transport support 23 is first lowered to the loading height H2 in order to move the article W away from the pressure applying portion 15. Subsequently, after the transport support 23 is projected to the projected position, the transport support 23 is lowered to the unloading height H1 to place the article W on the storage support 10, after which the transport support 23 is retracted to the retracted position.

Alternative Embodiments (1) In the embodiment described above, an exemplary arrangement is described in which the transfer vertical movement actuator vertically moves the transport support 23 with respect to the slide body 30. However, the invention is not limited to this arrangement. Instead, the transfer vertical movement actuator may vertically move the transfer device 14 with respect to the carriage main body 13.

(2) In the embodiment described above, the vertical movement motor 25 functions both as the transfer vertical movement actuator and the distance changing actuator. However, two separate actuators may be used to function as the transfer vertical movement actuator and the distance changing actuator respectively.

More specifically, for example, the transfer vertical movement actuator may be configured to vertically move the transport support 23 between the unloading height H1 and the loading height H2 by vertically moving the transfer device 14 with respect to the carriage main body 13. And the distance changing actuator 32 may be configured to switch, or change, the distance between the transport support 23 and the pressure applying portion 15 between the pressure applying distance and the spaced apart distance by vertically moving the transport support 23 with respect to the slide body 30.

(3) In the embodiment described above, an exemplary arrangement is described in which the distance changing actuator 32 vertically moves the transport support 23. However, the invention is not limited to this arrangement. And the distance changing actuator 32 may vertically move the pressure applying portion 15. Alternatively, both the transport support 23 and the pressure applying portion 15 may be vertically moved.

(4) In the embodiment described above, the pressure applying portion 15 includes the contact portion 34 for contacting the article W and the spring 35 for urging the contact portion 34 downwardly; therefore, a part of the pressure applying portion 15 that does not come into contact with the article W functions as the elastic member. However, a part of the pressure applying portion 15 that comes into contact with the article W may be an elastic member. Alternatively, the entire pressure applying portion 15 may be an elastic member.

Instead of the spring 35, the elastic member may be made of, or make use of, rubber, or urethane foam, etc.

(5) In the embodiment described above, an exemplary arrangement is described in which the main body portion 18 is suspended and supported by the travel portion 17 such that the main body portion 18 is located under the travel rails 1. However, the main body portion 18 may be supported by the travel portion 17 such that the main body portion 18 is located above the travel rails 1.

In addition, the article transport carriage is a ceiling transport vehicle 2 which is guided and supported by the travel rails 1 provided on the ceiling side in the embodiment described above. However, the article transport carriage may be an on-floor transport vehicle which is guided and supported by the travel rails provided on the floor.

What is claimed is:

1. An article transport carriage comprising:
    a carriage main body configured to travel along a travel path;
    a support portion configured to support a bottom surface of an article from below;
    a projecting and retracting actuator for horizontally projecting and retracting the support portion between a projected position in which the support portion is projected toward a transfer target location located to a side with respect to the carriage main body and a retracted position in which the support portion is retracted from the projected position toward the carriage main body;
    a pressure applying portion located directly above the article supported by the support portion in the retracted position; and
    a distance changing actuator for changing a subject distance which is a distance along the vertical direction between the support portion and the pressure applying portion;
    the carriage main body comprising a main body portion that supports both the support portion and the pressure applying portion;
    wherein the distance changing actuator is configured to change the subject distance to a pressure applying distance at which the pressure applying portion applies pressure from above on the article supported by the support portion, by moving the support portion in the retracted position and the pressure applying portion closer toward each other along the vertical direction, and is configured to change the subject distance to a spaced apart distance at which the support portion is allowed to be projected and retracted, by moving the support portion in the retracted position and the pressure applying portion away from each other along the vertical direction.

2. The article transport carriage as defined in claim 1, further comprising:
    a transfer vertical movement actuator for vertically moving the support portion in the projected position between a loading height and a unloading height which is lower than the loading height, when transferring an article to or from the transfer target location.

3. The article transport carriage as defined in claim 2,
    wherein defined as a height of the support portion is a pressure applying height which is higher than the loading height, and at which the subject distance becomes the pressure applying distance,
    wherein the loading height is defined to be a height at which the subject distance becomes the spaced apart distance, and
    wherein the transfer vertical movement actuator is configured to be able to change the height of the support portion to any of the loading height, the unloading height, and the pressure applying height, and is configured to function also as the distance changing actuator.

4. The article transport carriage as defined in claim 1,
    wherein the pressure applying portion includes an elastic member which deforms elastically as the pressure applying portion comes into contact with the article supported by the support portion as the subject distance is changed from the spaced apart distance to the pressure applying distance.

5. The article transport carriage as defined in claim 1, wherein the carriage main body is configured to be able to travel along the travel path while being guided and supported by travel rails provided on a ceiling side.

6. The article transport carriage as defined in claim 1,
    wherein the support portion in the retracted position is located within an interior space of the main body portion, and wherein the pressure applying portion is supported so as to be located in an upper portion of the interior space of the main body portion.

7. The article transport carriage as defined in claim 1, further comprising a transfer device having the support portion, the transfer device being for transferring an article from itself to the article transfer location, wherein the transfer device includes a base portion connected to the main body portion, and a slide body that slides in a horizontal direction with respect to the base portion, and wherein the support portion is supported by the slide body so as to be vertically movable with respect to the slide body.

8. The article transport carriage as defined in claim 1, wherein the pressure applying portion includes a contact portion that fits into a recessed portion formed in a top surface of the article.

* * * * *